(12) United States Patent
Erwin et al.

(10) Patent No.: US 9,431,359 B2
(45) Date of Patent: Aug. 30, 2016

(54) COAXIAL SOLDER BUMP SUPPORT STRUCTURE

(71) Applicant: International Business Machines Corporation, Armonk, NY (US)

(72) Inventors: Brian M. Erwin, Lagrangeville, NY (US); Ian Melville, Highland, NY (US); Ekta Misra, Fishkill, NY (US); George J. Scott, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 118 days.

(21) Appl. No.: 13/962,194

(22) Filed: Aug. 8, 2013

(65) Prior Publication Data

US 2013/0320528 A1 Dec. 5, 2013

Related U.S. Application Data

(62) Division of application No. 13/194,616, filed on Jul. 29, 2011, now Pat. No. 8,563,416.

(51) Int. Cl.
*H01L 23/48* (2006.01)
*H01L 23/00* (2006.01)

(52) U.S. Cl.
CPC .............. *H01L 24/13* (2013.01); *H01L 24/03* (2013.01); *H01L 24/05* (2013.01); *H01L 24/11* (2013.01); *H01L 2224/02166* (2013.01); *H01L 2224/03462* (2013.01); *H01L 2224/03464* (2013.01); *H01L 2224/03616* (2013.01); *H01L 2224/03848* (2013.01); *H01L 2224/03912* (2013.01); *H01L 2224/0401* (2013.01); *H01L 2224/05082* (2013.01); *H01L 2224/05083* (2013.01); *H01L 2224/05096* (2013.01); *H01L 2224/05124* (2013.01); *H01L 2224/05147* (2013.01); *H01L 2224/05155* (2013.01); *H01L 2224/05166* (2013.01); *H01L 2224/05171* (2013.01); *H01L 2224/05187* (2013.01);
(Continued)

(58) Field of Classification Search
CPC ....... H01L 24/03; H01L 24/05; H01L 24/10; H01L 24/11; H01L 24/13; H01L 2224/1012; H01L 2224/10125; H01L 2224/10126; H01L 2224/13014; H01L 2224/16055
USPC .................................................. 257/737, 738
See application file for complete search history.

(56) References Cited

U.S. PATENT DOCUMENTS 5,869,904 A 2/1999 Shoji
5,985,760 A 11/1999 Lauffer et al.
(Continued)

*Primary Examiner* — Hung Vu
(74) *Attorney, Agent, or Firm* — Scully, Scott, Murphy & Presser, P.C.; Steven J. Meyers

(57) ABSTRACT

A solder bump support structure and method of manufacturing thereof is provided. The solder bump support structure includes an inter-level dielectric (ILD) layer formed over a silicon substrate. The ILD layer has a plurality of conductive vias. The structure further includes a first insulation layer formed on the ILD layer. The solder bump support structure further includes a pedestal member formed on the ILD layer which includes a conductive material formed above the plurality of conductive vias in the ILD layer coaxially surrounded by a second insulation layer. The second insulation layer is thicker than the first insulation layer. The structure further includes a capping under bump metal (UBM) layer formed over, and in electrical contact with, the conductive material and formed over at least a portion of the second insulation layer of the pedestal member.

18 Claims, 7 Drawing Sheets

(52) U.S. Cl.
CPC ............... *H01L 2224/05582* (2013.01); *H01L 2224/05583* (2013.01); *H01L 2224/05644* (2013.01); *H01L 2224/05647* (2013.01); *H01L 2224/119* (2013.01); *H01L 2224/1132* (2013.01); *H01L 2224/1147* (2013.01); *H01L 2224/1148* (2013.01); *H01L 2224/11334* (2013.01); *H01L 2224/11462* (2013.01); *H01L 2224/11474* (2013.01); *H01L 2224/11849* (2013.01); *H01L 2224/13111* (2013.01); *H01L 2924/01322* (2013.01); *H01L 2924/12042* (2013.01); *H01L 2924/351* (2013.01); *H01L 2924/3511* (2013.01); *H01L 2924/3512* (2013.01)

(56) References Cited

U.S. PATENT DOCUMENTS

| | | | |
|---|---|---|---|
| 6,525,408 B2 | 2/2003 | Akram et al. | |
| 6,544,821 B2 | 4/2003 | Akram | |
| 6,559,390 B1 | 5/2003 | Tanaka | |
| 6,578,755 B1 | 6/2003 | Elenius et al. | |
| 6,696,644 B1 | 2/2004 | Chiu et al. | |
| 6,756,184 B2 | 6/2004 | Peng et al. | |
| 6,882,049 B2 | 4/2005 | Grigg | |
| 7,053,315 B2 | 5/2006 | Orui et al. | |
| 7,170,171 B2 | 1/2007 | Grigg | |
| 7,250,362 B2 | 7/2007 | Huang | |
| 7,465,653 B2 * | 12/2008 | Huang et al. | 438/613 |
| 7,482,200 B2 | 1/2009 | Chung | |
| 7,525,186 B2 | 4/2009 | Kim et al. | |
| 8,367,467 B2 | 2/2013 | Jang et al. | |
| 8,470,621 B2 * | 6/2013 | Kuo et al. | 438/28 |
| 2003/0134496 A1 | 7/2003 | Lee et al. | |
| 2007/0045780 A1 | 3/2007 | Akram et al. | |
| 2008/0293233 A1 | 11/2008 | Chinthakindi et al. | |
| 2012/0061827 A1 | 3/2012 | Fujita | |
| 2012/0313242 A1 * | 12/2012 | Sakuma et al. | 257/738 |
| 2013/0026621 A1 | 1/2013 | Tsai et al. | |

* cited by examiner

COAXIAL SOLDER BUMP SUPPORT STRUCTURE

CROSS REFERENCE TO RELATED APPLICATIONS

The present application is a divisional and claims priority under 35 U.S.C. §120 of U.S. patent application Ser. No. 13/194,616, filed on Jul. 29, 2011, which is incorporated by reference in its entirety.

BACKGROUND OF THE INVENTION

1. Field of the Invention

The present invention relates generally to the formation of solder joints to electrodes on a substrate, and more particularly, to coaxial solder bump support structures and method of manufacturing the same.

2. Description of the Related Art

Solder bumps are commonly used as an electrical connection between semiconductor chips and ceramic or organic substrates used to connect to the outside world. There are a variety of techniques that may be employed to connect the solder bump to the chip. One such technique utilizes one or more layers of protective material coated onto the finished chip to protect the last level of metallization from mechanical handling damage and corrosion or oxidation. This technique typically involves forming a via in the protective material in order to connect the solder to the last metallization layer. Once the solder bumps are deposited onto the chip, the chip is then joined to the substrate by positioning the chip so that the solder bumps are aligned with the appropriate pads on the substrate, then heated in a furnace to above the melting point of the solder. Because the substrate has a much larger coefficient of thermal expansion (CTE) than the chip, the substrate typically shrinks more than the chip during cooling to room temperature, causing shear stresses to develop on the solidified solder bumps. As the difference in the relative displacement between the surface of the substrate and that of the chip varies in proportion to the distance from the center of the chip, the outermost solder bumps experience the largest shear stresses.

The shear stresses resulting from the CTE mismatch exert a rotating moment on the solder bumps that is perpendicular to the radial direction from the center of the chip and the solder bump. This rotational energy typically causes tensile stress to be concentrated at the outer edge of the solder bump where it comes into contact with the chip, and this tensile stress acts to pull the solder away from the surface of the chip. If the last insulating layer on the chip is more compliant than the hard dielectrics that form the wiring insulation (for example, if the last insulation layer is a polyimide), the insulating layer can flex slightly in such a way that under repeated thermal cycles, or even during the cool down process from chip joining, the tensile stress can be transferred from the interface between the last conductive layer and the softer dielectric inward to the edge of the via. When either the above described heat treatment steps are repeated a large number of cycles or the tensile stress is of great enough magnitude, thermally induced solder bump cracks will result.

The mechanical properties of the protective insulator material that is found between the last metallization level and the solder bump play a large role in the amount of stress transferred to the chip. If the protective insulator level is more elastic, the solder bump and its correlating bump pad is able to flex more with the higher CTE substrate. Different types of protective insulator materials have their own advantages and disadvantages. For example, some protective insulator materials may have a very beneficial elasticity but also have a very high residual stress, which causes excessive wafer warp and bow. The term "warp", as used herein, refers to the maximum deviation between any location on a wafer and a plane passing through the center of gravity of the wafer mounted free of forces. The term "bow", as used herein, refers to the maximum deviation between any location on a wafer mounted free of forces and a plane which is defined by three points on the wafer forming an isosceles triangle. The bow is generally included in the warp and cannot be greater than the warp.

Typically, thickening the protective insulator material also proves to be beneficial for mitigating the stresses caused by the CTE mismatch of the chip and the substrate, but, unfortunately, this technique also increases the warp of the wafer as a whole. One should keep the bow and warp of the wafer within specifications to ensure that the subsequent semiconductor processing operations can be performed. Accordingly, it is desirable to provide solder bump support structures and method for fabricating those solder bump support structures with reduced wafer bow and warp.

SUMMARY OF THE INVENTION

In an aspect of the present invention, a solder bump support structure includes an inter-level dielectric (ILD) layer formed over a silicon substrate having a plurality of conductive vias. The solder bump support structure further includes a first insulation layer formed on the ILD layer. The solder bump support structure further includes a pedestal member formed on the ILD layer which includes a conductive material formed above the plurality of conductive vias surrounded by a second insulation layer, wherein the second insulation layer is thicker than the first insulation layer. The solder bump support structure further includes a capping under bump metal (UBM) layer formed over, and in electrical contact with, the conductive material and formed over at least a portion of the second insulation layer of the pedestal member.

In another aspect of the present invention, a method for fabricating a solder bump support structure includes forming an inter-level dielectric (ILD) layer over a silicon substrate. The method further includes forming an insulation layer over the ILD layer. The method further includes forming a plurality of via openings in the ILD layer. The plurality of via openings exposes a conductive portion of the silicon substrate. The method further includes filling the plurality of openings in the insulation layer and the plurality of via openings in the ILD layer with a conductive material. The method further includes forming a plurality of pedestal members above the plurality of via openings by selectively patterning the insulation layer. The method further includes forming a capping under bump metal (UBM) layer over, and in electrical contact with, the conductive material and over at least a portion of the insulation layer of the pedestal member.

A more complete understanding of the present invention, as well as further features and advantages of the present invention, will be obtained by reference to the following detailed description and drawings. It is to be understood that both the foregoing general description and the following detailed description are exemplary and explanatory only, and should not be considered restrictive of the scope of the present invention, as described and claimed. Further, features or variations may be provided in addition to those set forth herein. For example, embodiments of the present invention may be directed to various combinations and sub-combinations of the features described in the detailed description.

BRIEF DESCRIPTION OF THE SEVERAL VIEWS OF THE DRAWINGS

The present invention is described in the detailed description which follows in reference to the noted plurality of drawings by way of non-limiting examples of exemplary embodiments of the present invention.

DETAILED DESCRIPTION OF THE PREFERRED EMBODIMENTS

The present invention relates to a structure and method of forming a solder bump support structure. More specifically, the present invention includes an inter-level dielectric (ILD) layer formed over a silicon substrate having a plurality of conductive vias. The solder bump support structure further includes a first insulation layer formed on the ILD layer. The solder bump support structure further includes a pedestal member formed on the ILD layer containing a conductive material formed above the plurality of conductive vias surrounded by a second insulation layer, wherein the second insulation layer is thicker than the first insulation layer. The solder bump support structure further includes a capping under bump metal (UBM) layer formed over, and in electrical contact with, the conductive material and formed over at least a portion of the second insulation layer of the pedestal member. Advantageously, by removing the majority of the insulation layer between the pedestal members, the structure of the present invention is an improvement over prior art as it allows one to substantially reduce the amount of warp induced on the wafer due to the high stresses of the thick protective insulator.

In embodiments, the structure of the present invention is an improvement over prior art as it allows one to reduce the thickness of protective insulator material between the pedestal member structures and, as a result, allows one to use more stressful protective insulator materials. Generally, the amount of warp induced on a wafer is directly proportional to the thickness of protective insulator material present across the surface of the wafer (approximately 1:1 ratio). Therefore, for illustration purposes only, if a prior art method of covering the entire wafer with a protective insulator material of substantially uniform thickness imparts, for example, a 200 micron of bow on the wafer, the structure of the present invention may allow one to reduce the total amount of protective insulator by 50%, in turn, reducing the imparted bow to 100 microns. Another advantage of the present invention is that the method of forming a solder ball support structure disclosed herein utilizes excimer laser pulse technology, which allows one to perform depth-specific patterned etching of the protective insulator material. Furthermore, the use of an excimer laser as disclosed herein improves the solder bump support structure by allowing one to form substantially vertical via sidewalls in the protective insulator material.

FIGS. 1 through 12 schematically illustrate method steps for fabrication of a solder bump support structure in accordance with an embodiment of the present invention.

Figure 1:
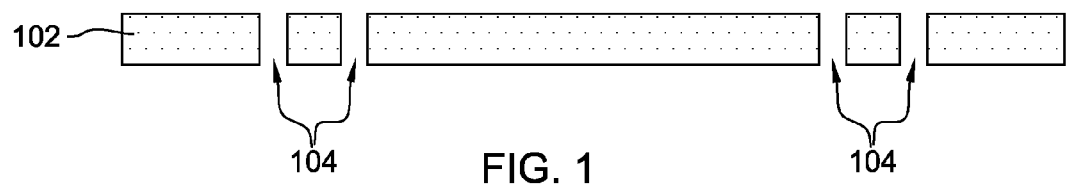
FIGS. 1 through 12 schematically illustrate method steps for fabrication of a solder bump support structure in accordance with an embodiment of the disclosure.

Referring to FIG. 1, the method in accordance with this exemplary embodiment of the present invention begins with a deposition of an ILD layer 102. ILD layer 102 may include a material, such as, but not limited to silicon nitride, to assist in the formation of subsequent layers as is known in the art. ILD material 102 may be deposited via plasma enhanced chemical vapor deposition (PECVD) or via low pressure chemical vapor deposition (LPCVD) procedures to a thickness between about 0.1 to 5 microns. It should be noted that ILD layer 102 may include multiple layers of ILD materials. Additional ILD layers may include, for example, but not limited to, silicon oxide, or of borophosphosilicate glass (BPSG). The lowest ILD layer may be overlying and contacting a conductive region in a semiconductor substrate. This is not shown in the drawings.

Still referring to FIG. 1, an anisotropic reactive ion etching (RIE) procedure is next performed using, for example, a mask, and using $CHF_3$ as an etchant for ILD layer 102, creating via openings 104, shown schematically in FIG. 1. Via openings 104 have an area in the range from about 1 to about 750 square microns.

Figure 2:
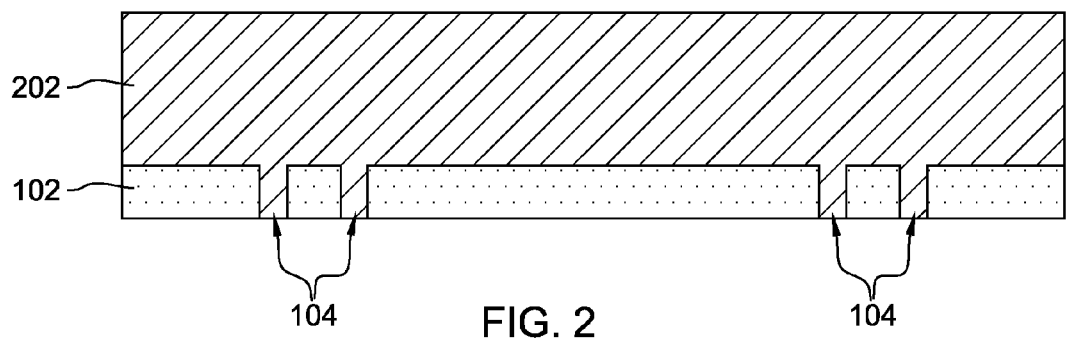

Once via openings 104 are formed, an insulation layer 202 is formed so as to cover ILD layer 102 and fill via openings 104, as shown in FIG. 2. In one embodiment, insulation layer 202 includes a film of spin-on protective insulator. It should be noted that the protective insulator film may be applied in many coats to improve planarization. In this case, a first coat is spun on ILD layer 102, which should be precured; a second coat is spun on overtop of the underlying precured coat, which is precured; a third coat is spun on overtop of the underlying precured coat, which is precured; etc., after which the entire precured multicoated insulation layer 202 is cured in a furnace as known in the art. In some embodiments, insulation layer 202 may include an insulating layer in the form of a dry film. Illustrative examples of the type of films that may be used to form insulation layer 202 include, but are not limited to, polymeric films such as polyimide, poly(benzoxazole), polynorbornene, acyrolates, epoxies, acrylics, silicones, benzocyclobutene-based polymers, and the like. Insulation layer 202 may be formed to a thickness in the range from about 1 to about 25 microns.

Figure 3:
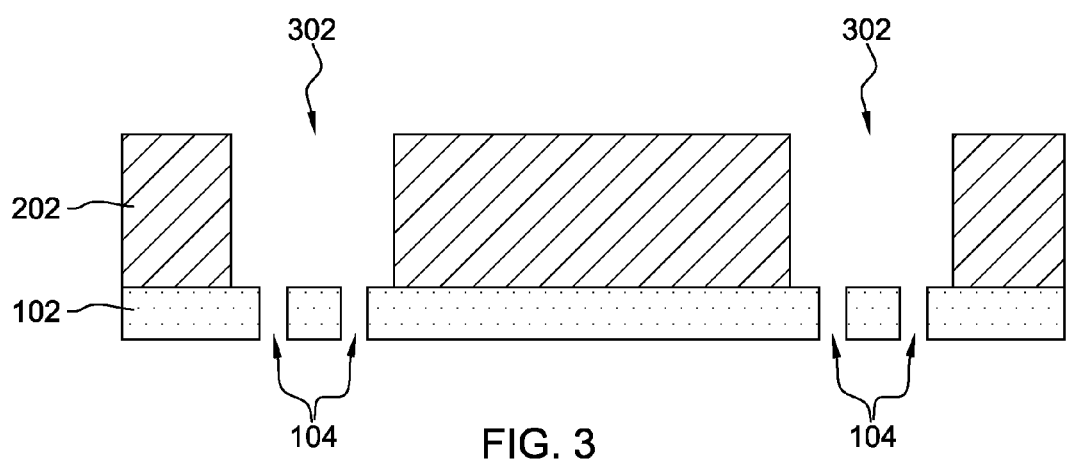

After that, conductive via openings 302, which expose via openings 104 in the ILD layer 102, are formed in the insulation layer 202, as shown in FIG. 3. A pulsed excimer laser may be utilized in this step because of its unique advantageous characteristics discussed below, which lend themselves to efficient laser etching of protective insulator film with few drawbacks. Pulsed excimer laser is capable of emitting a characteristic wavelength which is within the absorption spectrum of the protective insulator material 202. If an excimer laser is used, a mask of a conventional type (not shown), which includes, for example, but not limited to, a UV grade quartz substrate having a patterned aluminum or dielectric film thereon, may be utilized in this step. The mask will be transparent to the laser light in the regions where there is no aluminum or dielectric film and opaque in the regions where the aluminum or dielectric is present. As a result, light from the laser will be transmitted by the mask in a pattern corresponding to the transparent regions of the mask. In this case, transparent regions of the mask will correspond to the desired pattern of conductive via openings 302.

When pulsed excimer laser radiation strikes protective insulator 202, protective insulator 202 will, due to absorption of the radiation, undergo thermal and electronic excitation and, ultimately, vaporize thereby exposing a new layer of protective insulator 202 in accordance with the desired pattern. Protective insulator layer 202 in the regions, which were not irradiated, remains unaffected. The newly exposed protective insulator is once again irradiated with another pulse of excimer laser radiation and ablated. In this manner, protective insulator 202 is etched layer by layer until the entire protective insulator is etched through forming the desired conductive via openings 302 pattern, as shown in FIG. 3.

The etch rate of protective insulator 202 is a function of several parameters including the temperature and pressure in the reaction chamber, the energy density, wavelength, pulse width and repetition rate of the excimer laser, and the density of the protective insulator 202. Typically, these parameters depend largely on the materials selected for protective insulator layer 202.

Figure 4:
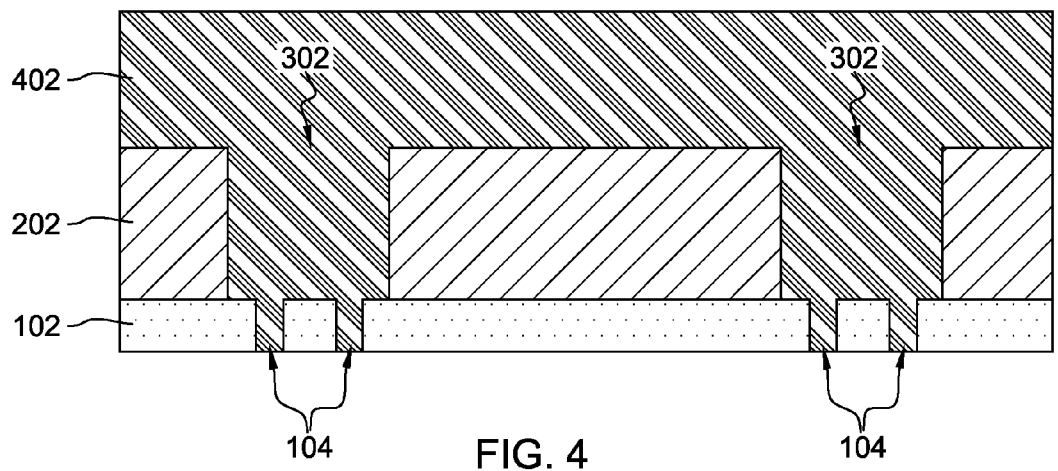

Turning now to FIG. 4, a continuous layer 402 of a conductive material, such as copper (Cu) may be plated on the protective insulator film 202. It should be understood that a layer of a liner material (not shown) may be deposited prior to plating the conductive material. The exemplary copper metal layer 402 may be formed by contacting the protective insulator film 202 with a copper plating bath in a processing system configured for copper plating and annealing. The copper plating process may be an electrochemical copper plating process or electroless copper plating process. The conductive material layer 402 may have a thickness in the range from about 1 to about 25 microns. According to embodiments of the present invention, the conductive material layer 402 completely fills via openings 302 in the protective insulator layer 202, as well as via openings 104 in the ILD layer 102, as depicted in FIG. 4. According to embodiments of the present invention, following deposition of the conductive material layer 402, it may be annealed in a non-oxidizing gas to improve material properties of the metal.

Figure 5:
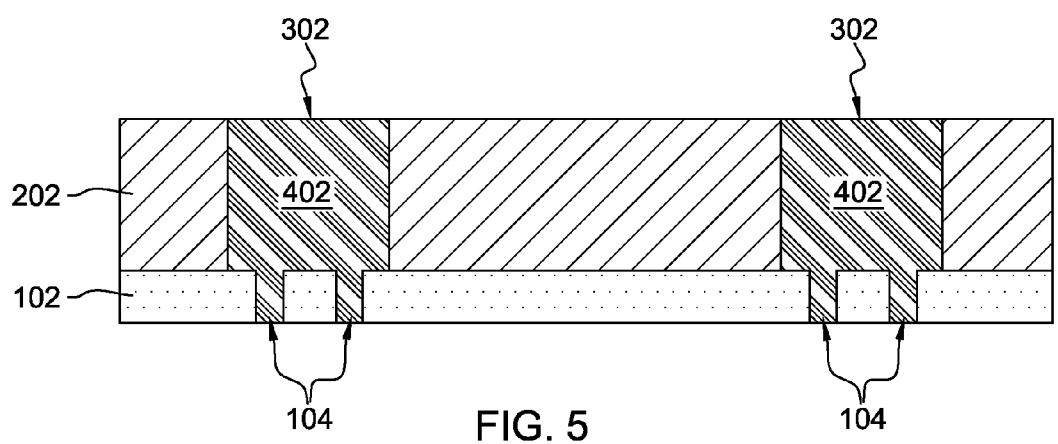

FIG. 5 illustrates a next step in the process. Copper chemical mechanical planarization (CMP) is used to remove the copper layer 402 from the protective insulator 202 surface while maintaining copper 402 in conductive vias 302 through the protective insulator layer 202 and conductive vias 104 through the ILD layer 102.

Figure 6:
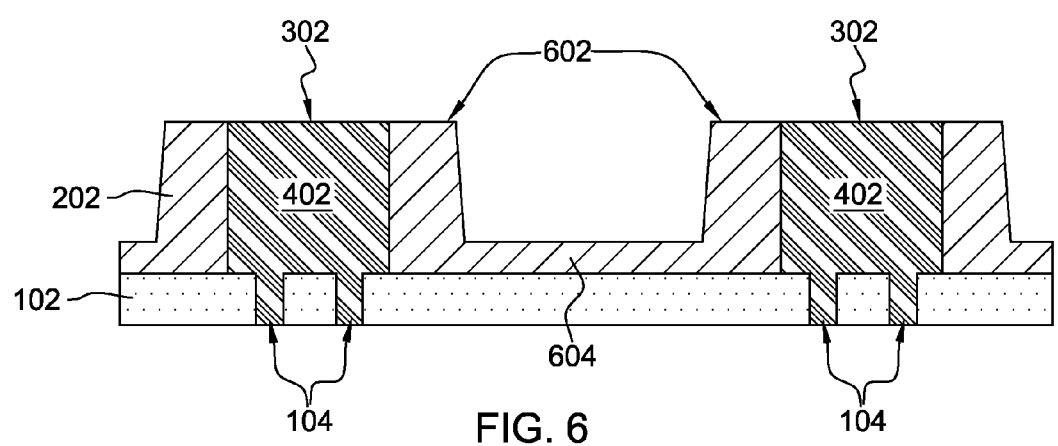

FIG. 6 illustrates a next step in the process of forming the solder bump support structure. A plurality of pedestal members 602 is formed by utilizing a pulsed excimer laser technique once again, as discussed above in conjunction with FIG. 3. In this case, a conventional mask with opaque regions corresponding to the desired shapes of the pedestal members 602 may be utilized. Protective insulator material 202 is etched away layer by layer until a layer 604 of protective insulator having the thickness in the range from about 0.1 to about 5 microns is left between the formed pedestal members 602. It should be noted that the thickness of layer 604 is less than the height of pedestal members 602. A plurality of solder bumps will be formed over the plurality of pedestal members 602, as discussed further below in conjunction with FIGS. 8-12.

Figure 7:
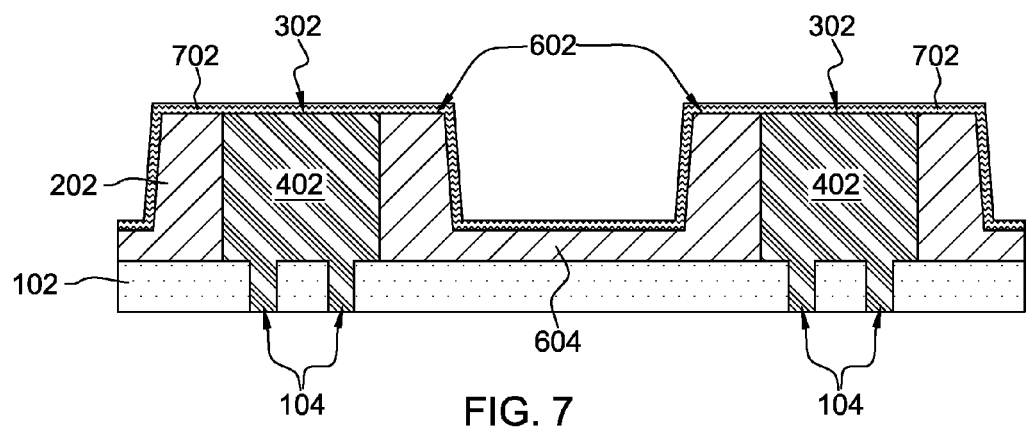

Next, an under bump metal (UBM) layer 702 is deposited to provide a thickness in the range from about 0.1 to about 2 microns, as shown in FIG. 7. Different methods of providing under bump metal deposition are known in the art. Usually UBM is sputtered or evaporated. The UBM deposition provides a barrier to protect the pedestal members 602. The UBM deposition also provides better adhesion between solder bumps and the pedestal members 602. Generally, UBM deposition includes a layered stack of various combinations of metals. Preferably, such stacks are two or three layer stacks. Various metal combinations are known in the art to be used for UBM deposition. Such combinations may be aluminum/nickel-vanadium/copper, aluminum/nickel/copper, titanium/copper, chromium/chromium-copper/copper, and nickel/gold. The nickel/gold deposition may be deposited by electroless plating in the preferred embodiment to form nickel/gold UBM.

Figure 8:
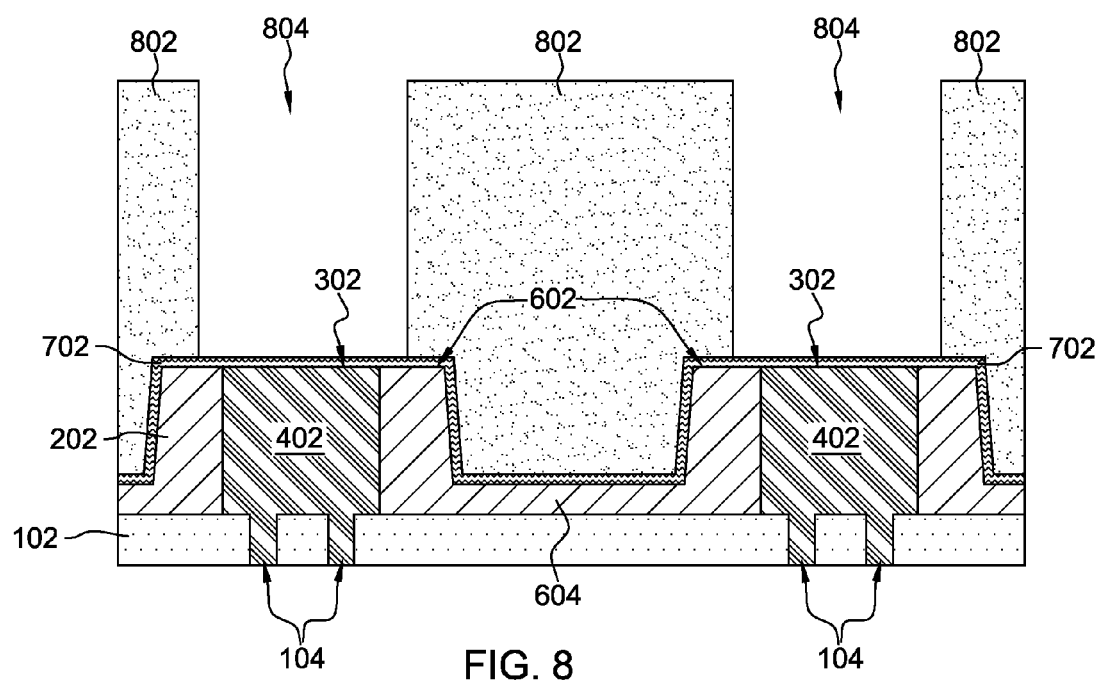

FIG. 8 shows a thick layer of a photoresist 802 which may be applied by spin coating, either by a single spin or multiple spin of liquid resist to provide a thickness in the range from about 1 to about 150 microns. Alternatively, a dry film may be laminated directly. This photoresist layer 802 may be patterned by selectively exposing it to ultra violet (or visible) light through a photomask having openings arranged therein at the appropriate locations to define the areas to be bumped 804, and developing the exposed photoresist to create the desired pattern of photoresist. Typical parameters for forming the thick photoresist layer 802 are well known in the art.

Figure 9:
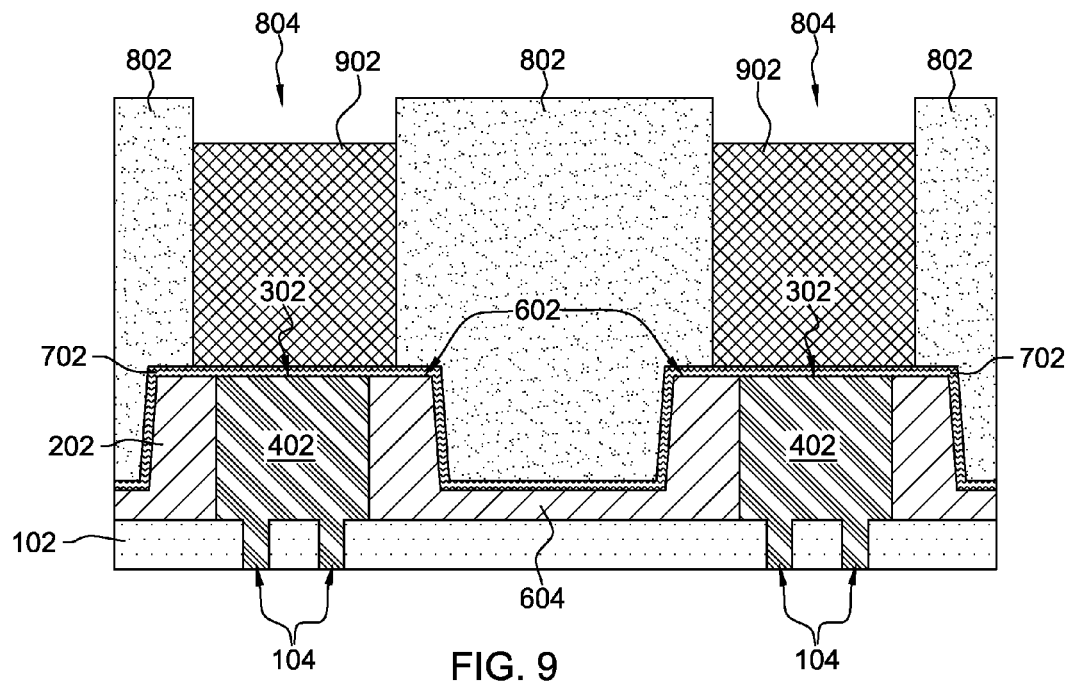

The exposed UBM 702 is then provided with the solder bump 902, as indicated in FIG. 9. The solder bump 902 may include a variety of compositions. Lead/tin alloys are the most commonly employed, in particular eutectic lead/tin, although, increasingly, other solder compositions are utilized. Other solder compositions may include, for example, but not limited to, pure tin, tin-copper alloys, tin-silver alloys, tin-bismuth alloys, tin-silver-copper alloys, or the like. The solder bump 902 may be applied by a variety of techniques, such as screen printing or solder ball placement, but electroplating is the most common technique. The electroplating of eutectic lead/tin is well documented.

Figure 10:
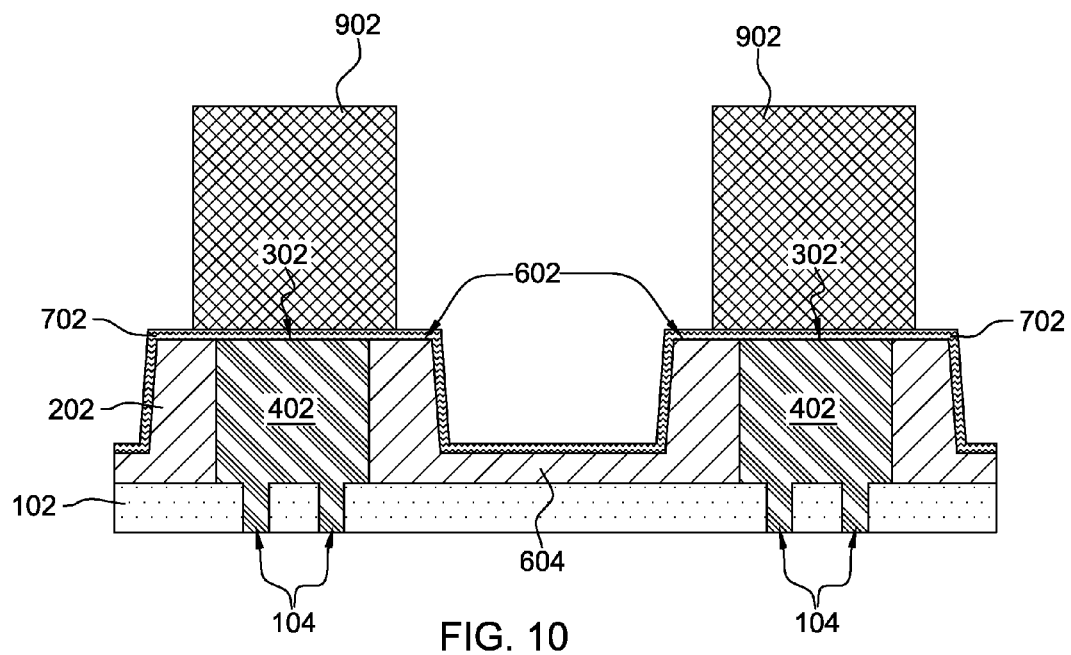

Following the plating of the bumps, FIG. 10 shows the photoresist 802 removed. This may be achieved using a chemical technique employing a liquid stripper as well known in the art. In another embodiment, photoresist layer 802 may be removed by using exposure and development.

Figure 11:
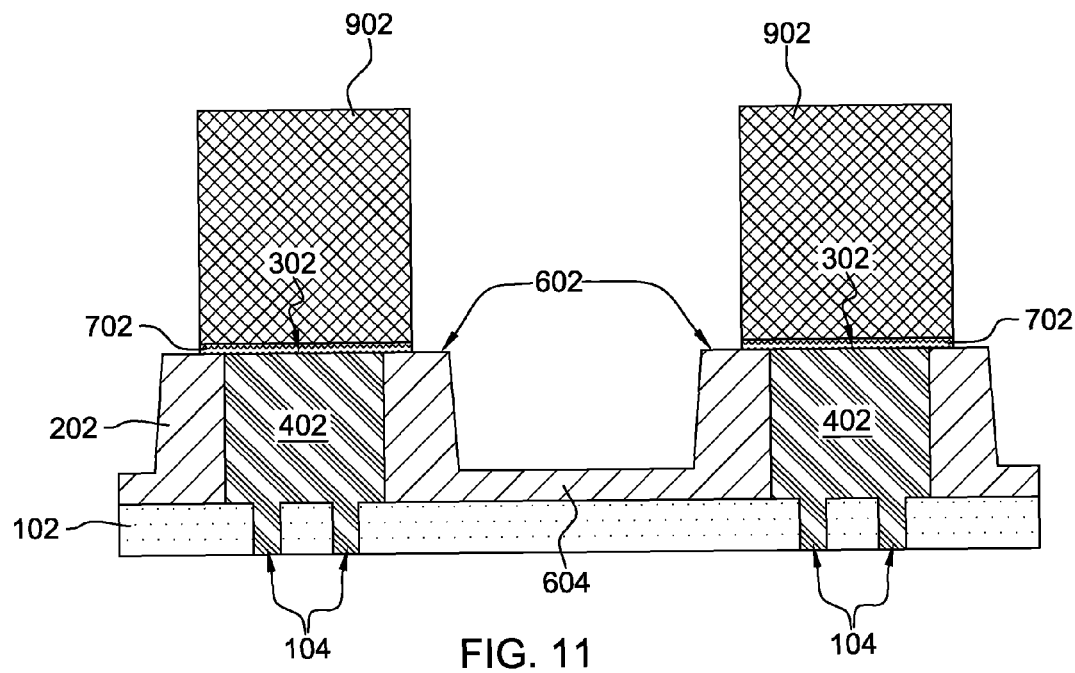

After removal of the photoresist layer 802, as shown in FIG. 11, the UBM layer 702 is subject to an etching process, such as, but not limited to, wet etching or RIE, to the underlying protective insulator layer 202 using the solder column 902 as an etching mask to protect the underlying UBM layer 702. Following the step of etching the UBM layer 702, the solder column 902 is then temporarily heated to a melting point ("reflow") such that surface tension effects create a substantially spherical solder bump 902 over UBM layer 702, as depicted in FIG. 12.

Figure 12:
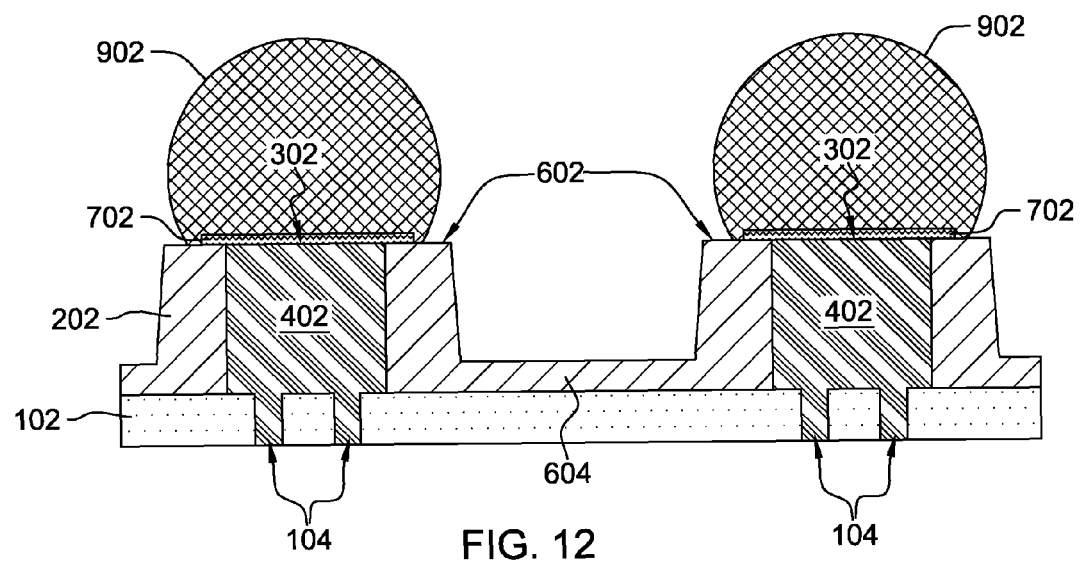

FIG. 12 shows the final solder bump support structures. As can be seen in FIG. 12, a plurality of pedestal members 602 are formed over the ILD layer 102. Pedestal members 602 include a conductive via 302 coaxially surrounded by a thick protective insulator layer 202. Conductive via 302 is used to provide electrical contact between a solder bump 902 positioned on the capping UBM layer 702 and the plurality of conductive vias 104 in the ILD layer 102, which in turn are connected to underlying metal interconnect layers. It should be noted that protective insulator layer 604 surrounding pedestal members 602 is substantially thinner than protective insulator layer 202 that is part of the pedestal member 602.

Figure 13A:
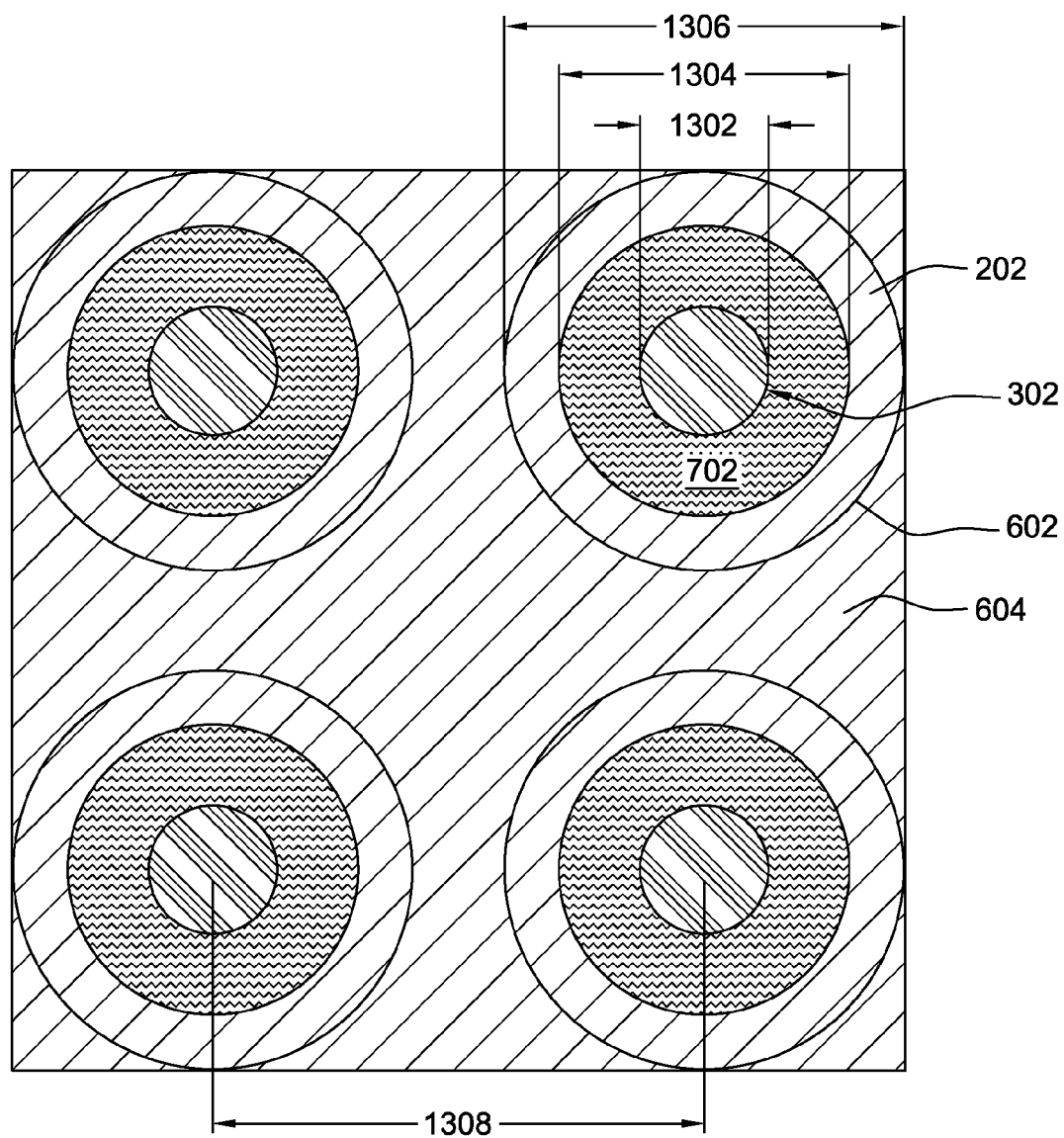
FIG. 13A illustrates a top view of a solder bump support structure prior to a solder bump formation step in accordance with an embodiment of the present invention.

FIG. 13A illustrates a top view of a solder bump support structure prior to a solder bump formation step. In an exemplary embodiment, as shown in FIG. 13A, a plurality of pedestal members 602 are rising up from the underlying wafer having substantially cylindrical shape. In this exemplary embodiment, conductive via 302 may have a diameter 1302 in the range from about 5 to about 55 microns. As depicted in FIG. 13A, the ring-shaped capping UBM layer 702 covers a portion of the conductive material layer 402 contained in the conductive via 302 and at least a portion of the protective insulator layer 202 of the pedestal member 602. The outer diameter 1304 of the UBM layer 702 may be in the range from about 10 to about 120 microns. The protective insulator layer 202 of the cylindrically shaped pedestal member 602 may have an outer diameter 1306 in the range from about 20 to about 135 microns. Furthermore, in this exemplary embodiment, the distance 1308 between the centers of the adjacent pedestal members 602 may be, for example, but not limited to, about 150 microns. While in the exemplary embodiment the pedestal support member 602 has a substantially cylindrical shape, the present invention is not so limited. Those of ordinary skill in the art will recognize that in other embodiments the pedestal support member 602 may have other shapes.

Figure 13B:
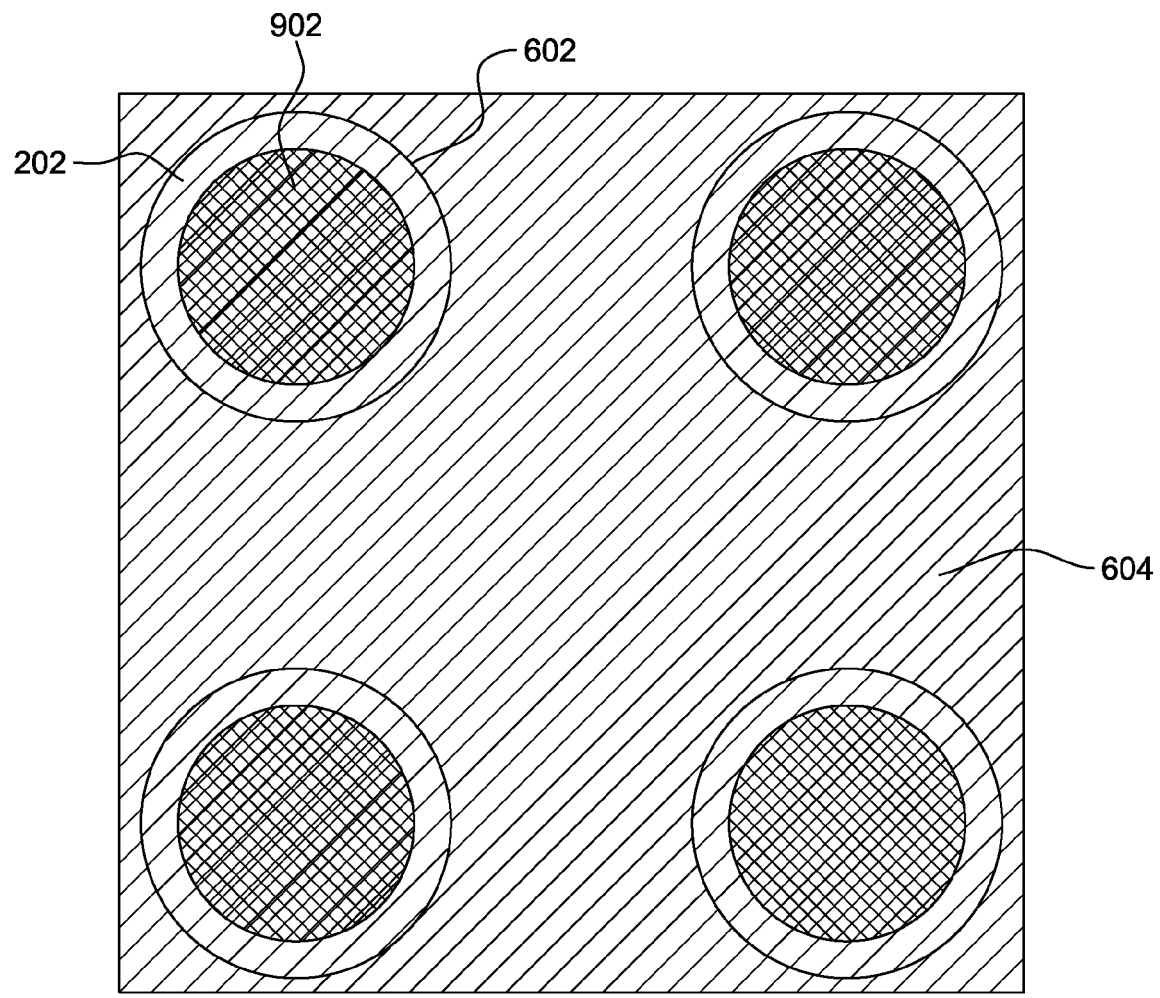
FIG. 13B illustrates a top view of a solder bump support structure following the solder bump formation step in accordance with an embodiment of the present invention.

FIG. 13B illustrates a top view of a solder bump support structure following the solder bump formation step in accordance with an embodiment of the present invention. As shown in FIG. 13B substantially spherical solder bumps 902 are formed over UBM layer (not shown) on the top surface of each pedestal member 602.

Thus, as described above, the present invention relates to a structure and a method of forming a solder bump support structure. It has thus been discovered that the present invention has numerous advantages. A principle advantage is that by utilizing a thick layer of protective insulator film 202 within a structure of plurality of pedestal members 602, where the solder bump 902 protection is needed the most, and reducing the thickness of the protective insulator on the surface of the chip 604, between pedestal members 602, the wafer warp caused by the protective insulator film is substantially reduced when compared to prior art methods of forming solder bump support structures. Accordingly, the reliability concerns associated with prior art methods of forming solder bump structures can be avoided.

Another advantage is that utilization of etching methodology presented herein enables a reduction in the process steps required to form a pedestal member.

The terminology used herein is for the purpose of describing particular embodiments only and is not intended to be limiting of the present invention. As used herein, the singular forms "a", "an" and "the" are intended to include the plural forms as well, unless the context clearly indicates otherwise.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the present invention in the form disclosed. Many modifications and variations will be apparent to those of ordinary skill in the art without departing from the scope and spirit of the present invention. The embodiments were chosen and described in order to best explain the principles of the present invention and the practical application, and to enable others of ordinary skill in the art to understand the present invention for various embodiments with various modifications as are suited to the particular use contemplated.

What is claimed is:

1. A solder bump support structure comprising:
   an inter-level dielectric (ILD) layer formed over a silicon substrate, wherein the ILD layer includes a plurality of conductive vias;
   a first insulation layer formed on the ILD layer;
   a pedestal member formed on the ILD layer comprising a conductive material formed above the plurality of conductive vias coaxially surrounded by a second insulation layer in direct physical contact with the conductive material of the pedestal member, wherein the first insulation layer and the second insulation layer are part of a same layer, wherein the first insulation layer extends horizontally from a lower portion of the second insulation layer along and in direct physical contact with a top surface of the ILD layer, and wherein the second insulation layer is thicker than the first insulation layer; and
   a capping under bump metal (UBM) layer formed over, and in electrical contact with, the conductive material and in direct physical contact with only a portion of an uppermost surface of the second insulation layer of the pedestal member.

2. The solder bump support structure of claim 1, wherein the thickness of the first insulation layer ranges from about 0.1 to about 5 microns.

3. The solder bump support structure of claim 1, wherein the thickness of the second insulation layer ranges from about 1 to about 25 microns.

4. The solder bump support structure of claim 1, wherein the first insulation layer comprises a spin-on polymer.

5. The solder bump support structure of claim 1, wherein the first insulation layer comprises a dry-film polymer.

6. The solder bump support structure of claim 1, wherein the conductive material comprises a via providing electrical contact between the capping UBM layer and the plurality of conductive vias in the ILD layer.

7. The solder bump support structure of claim 1, wherein the conductive material comprises copper.

8. The solder bump support structure of claim 1, wherein the pedestal member is shaped as a cylinder and the capping UBM is shaped as a ring, and wherein the conductive material of the pedestal member includes a pair of opposing vertical sidewalls which are each substantially perpendicular to the silicon substrate.

9. The solder bump support structure of claim 8, wherein an outer diameter of the capping UBM layer ranges between about 10 to about 120 microns.

10. The solder bump support structure of claim 8, wherein a diameter of the second insulation layer ranges between about 20 to about 135 microns.

11. A structure comprising:
    a pedestal member comprising a conductive material coaxially surrounded by a protective insulator material in direct physical contact with the conductive material of the pedestal member, the pedestal member being above an inter-level dielectric layer;
    an insulator layer above the inter-level dielectric layer and adjacent to the pedestal member, wherein the protective insulator material and the insulator layer are part of a same layer, wherein the insulator layer extends horizontally from a lower portion of the protective insulator material along and in direct physical contact with a top surface of the inter-level dielectric layer, the insulator layer being the same material as the protective insulator material of the pedestal member, and a height of the insulator layer above the inter-level dielectric is less than a height of the pedestal member;

a solder bump above the pedestal member, the solder bump being in electrical contact with the conductive via of the pedestal member; and an under bump metal layer between the pedestal member and the solder bump, the under bump metal layer being in direct physical contact with only a portion of an uppermost surface of the protective insulator material.

12. The structure of claim 11, wherein the inter-level dielectric layer comprises a conductive via in electrical contact with the conductive material of the pedestal member.

13. The structure of claim 11, wherein the protective insulator material of the pedestal member comprises substantially vertical sidewalls.

14. The structure of claim 11, wherein the conductive material is an electrical path between the solder bump and the conductive via.

15. The structure of claim 11, wherein the pedestal member is shaped as a cylinder, and the under bump metal layer is shaped as a ring, and wherein the conductive material of the pedestal member includes a pair of opposing vertical sidewalls which are each substantially perpendicular to the silicon substrate.

16. A structure comprising:
a pedestal member comprising a conductive material coaxially surrounded by a protective insulator material in direct physical contact with the conductive material of the pedestal member, the pedestal member being above an inter-level dielectric layer;

an insulator layer above the inter-level dielectric layer and adjacent to the pedestal member, wherein the protective insulator material and the insulator layer are part of a same layer, wherein the insulator layer extends horizontally from a lower portion of the protective insulator material along and in direct physical contact with a top surface of the inter-level dielectric layer, the insulator layer being the same material as the protective insulator material of the pedestal member, and a height of the insulator layer above the inter-level dielectric is less than a height of the pedestal member; and an under bump metal layer above the pedestal member, the under bump metal layer is in electrical contact with the conductive material of the pedestal member, and is in direct physical contact with only a portion of an uppermost surface of the protective insulator material of the pedestal member.

17. The structure of claim 16, wherein the inter-level dielectric layer comprises a conductive via in electrical contact with the conductive material of the pedestal member.

18. The structure of claim 16, further comprising:
a solder bump above the pedestal member, the solder bump being in electrical contact with the conductive via of the pedestal member.

* * * * *